(12) United States Patent
Shirai et al.

(10) Patent No.: US 8,188,739 B2
(45) Date of Patent: May 29, 2012

(54) NUCLEAR MAGNETIC RESONANCE IMAGING APPARATUS

(75) Inventors: Toru Shirai, Koganei (JP); Yoshitaka Bito, Kokubunji (JP); Yo Taniguchi, Kokubunji (JP); Satoshi Hirata, Kodaira (JP)

(73) Assignee: Hitachi Medical Corporation, Tokyo (JP)

( * ) Notice: Subject to any disclaimer, the term of this patent is extended or adjusted under 35 U.S.C. 154(b) by 278 days.

(21) Appl. No.: 12/519,197

(22) PCT Filed: Jun. 29, 2007

(86) PCT No.: PCT/JP2007/063079
§ 371 (c)(1),
(2), (4) Date: Dec. 15, 2009

(87) PCT Pub. No.: WO2008/072393
PCT Pub. Date: Jun. 19, 2008

(65) Prior Publication Data
US 2010/0097062 A1    Apr. 22, 2010

(30) Foreign Application Priority Data

Dec. 15, 2006  (JP) ................................ 2006-338488

(51) Int. Cl.
*G01V 3/00* (2006.01)
(52) U.S. Cl. ........................................ 324/318; 324/322

(58) Field of Classification Search .......... 324/300–322; 600/407–445
See application file for complete search history.

(56) References Cited

U.S. PATENT DOCUMENTS

| | | | |
|---|---|---|---|
| 4,585,993 A | 4/1986 | Bottomley | |
| 6,272,369 B1 * | 8/2001 | Tan | 600/410 |
| 7,627,359 B2 * | 12/2009 | Yarnykh et al. | 600/410 |
| 8,078,693 B2 * | 12/2011 | Luk et al. | 709/219 |
| 2010/0268066 A1 * | 10/2010 | Rehwald et al. | 600/419 |
| 2011/0221439 A1 * | 9/2011 | Posse | 324/307 |
| 2012/0013336 A1 * | 1/2012 | Hetzer et al. | 324/309 |

FOREIGN PATENT DOCUMENTS

| | | |
|---|---|---|
| JP | 60-168041 | 8/1985 |
| JP | 05-237075 | 9/1993 |

* cited by examiner

*Primary Examiner* — Brij Shrivastav
(74) *Attorney, Agent, or Firm* — Antonelli, Terry, Stout & Kraus, LLP.

(57) ABSTRACT

A method for obtaining the most appropriate amplitude of signal suppression pulse, which suppresses unnecessary signals from the substance not subjected to measurement, highly accurately, swiftly and stably, and an MRI apparatus that enables the optimization are provided.

A pulse amplitude adjusting means equipped in the MRI apparatus acquires signals while changing the amplitude of signal suppression pulse and calculates signal absolute values and phase values, and computes reference signals, which are polarized signal absolute values, based on the changes in signal phase values. This reference signals are subjected to polynomial fitting. A value which makes this fitting curve is 0 or closes to 0 is set as the optimal pulse amplitude.

18 Claims, 14 Drawing Sheets

[Figure 1]
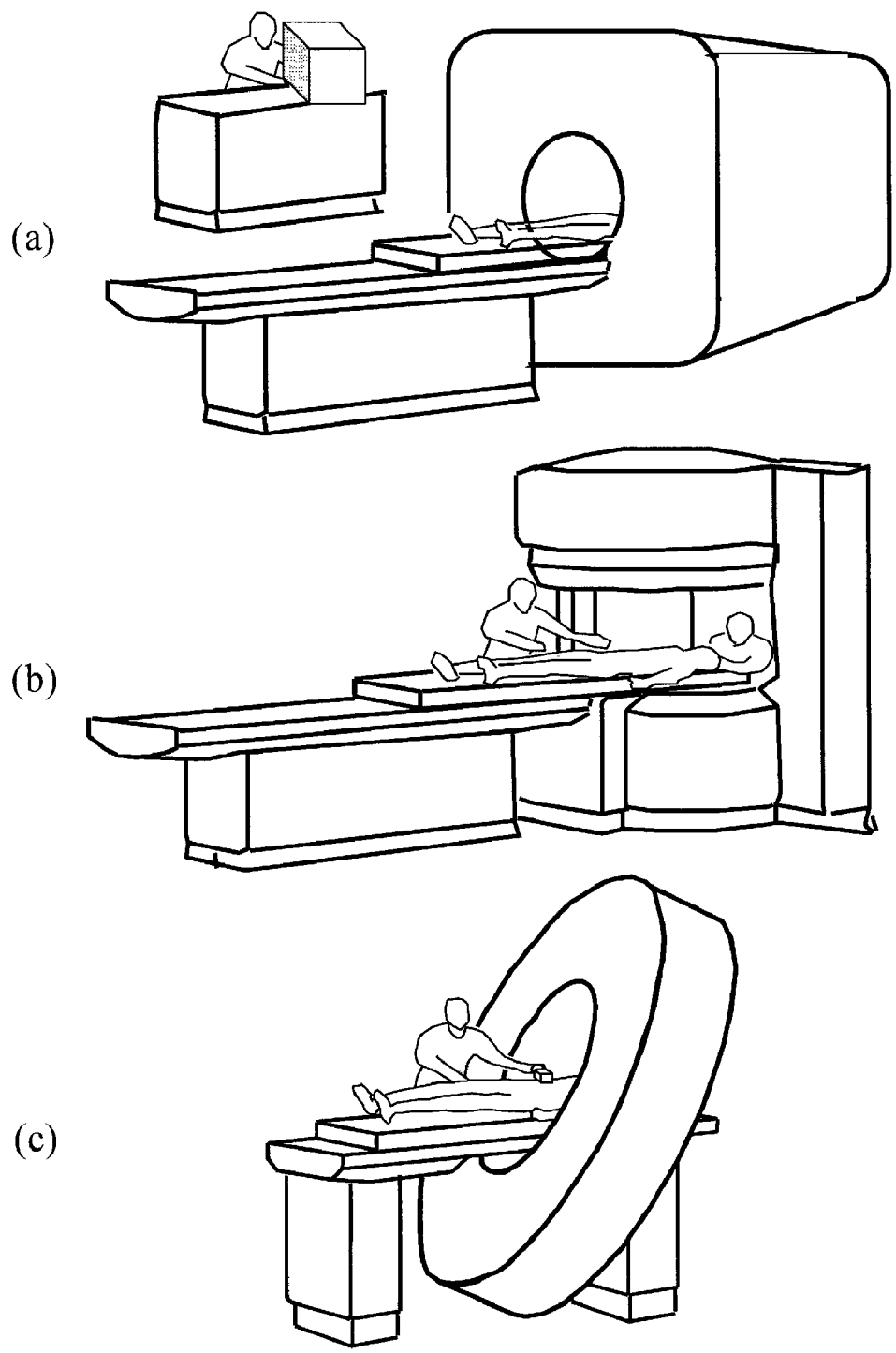

[Figure 2]
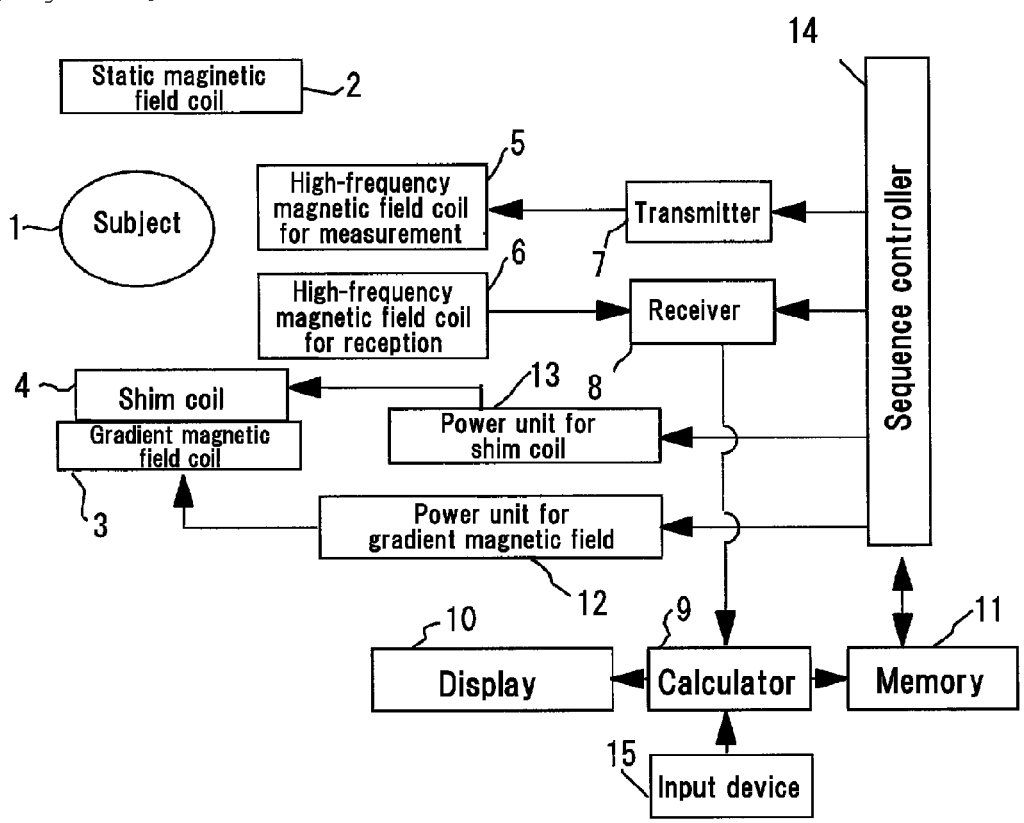

[Figure 3]
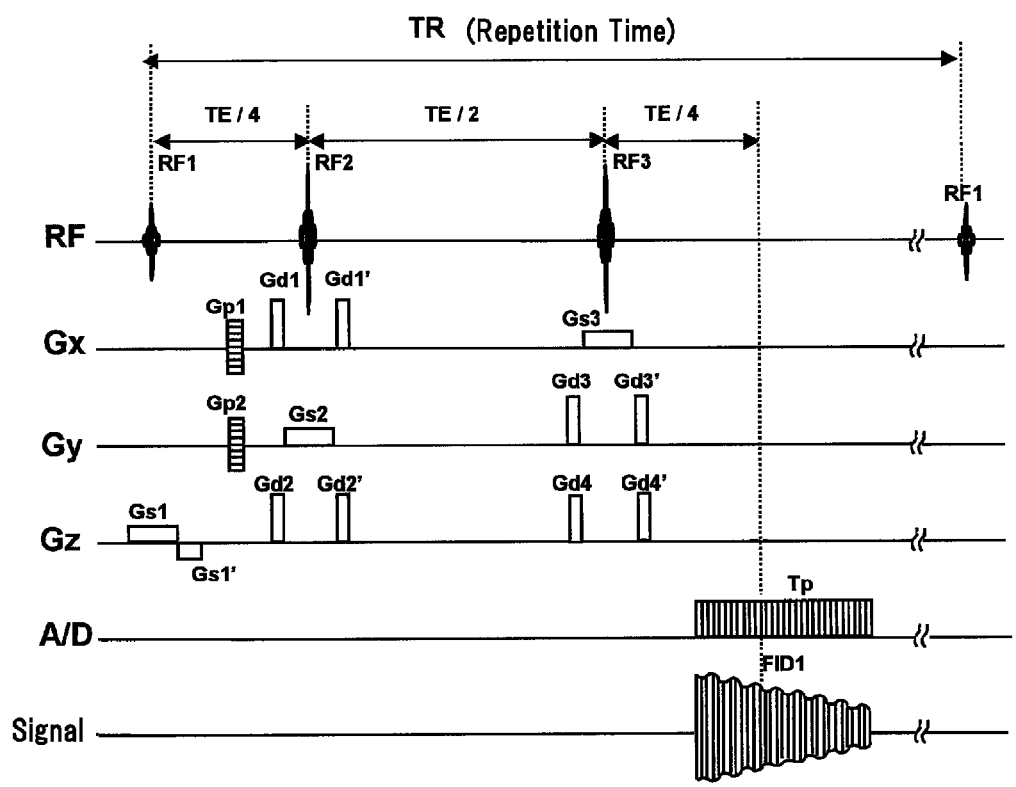

[Figure 4]
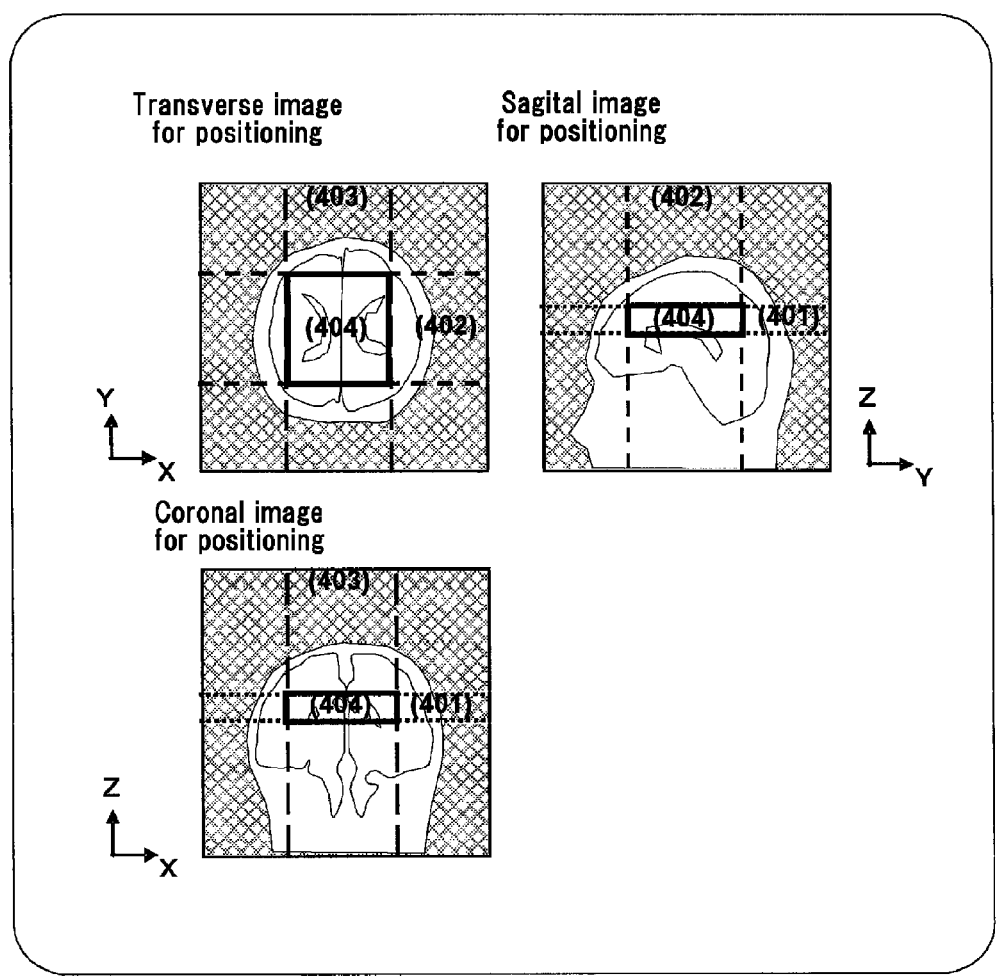

[Figure 5]
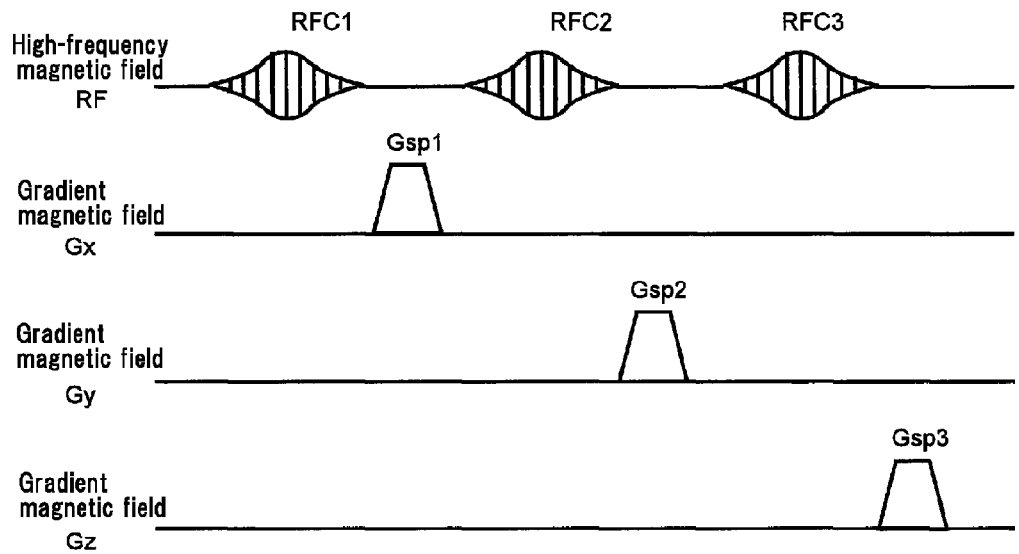
[Figure 6]
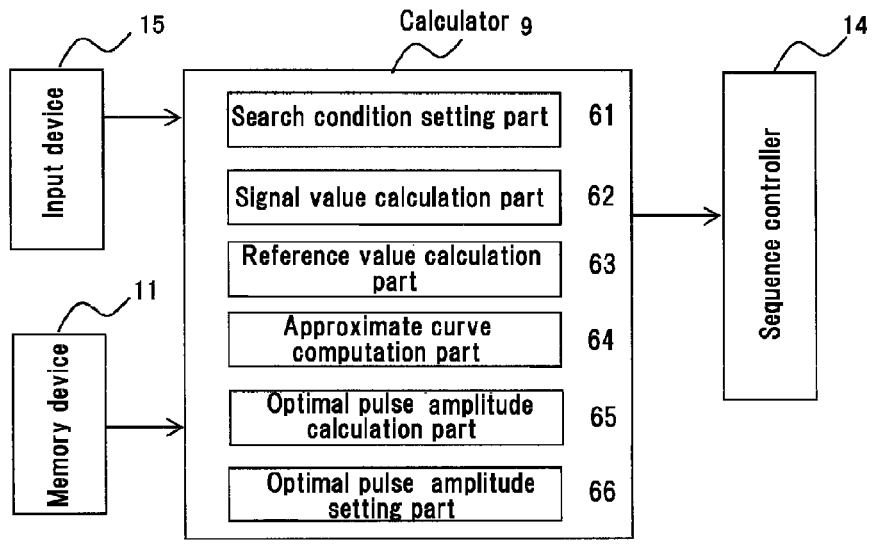

[Figure 7]
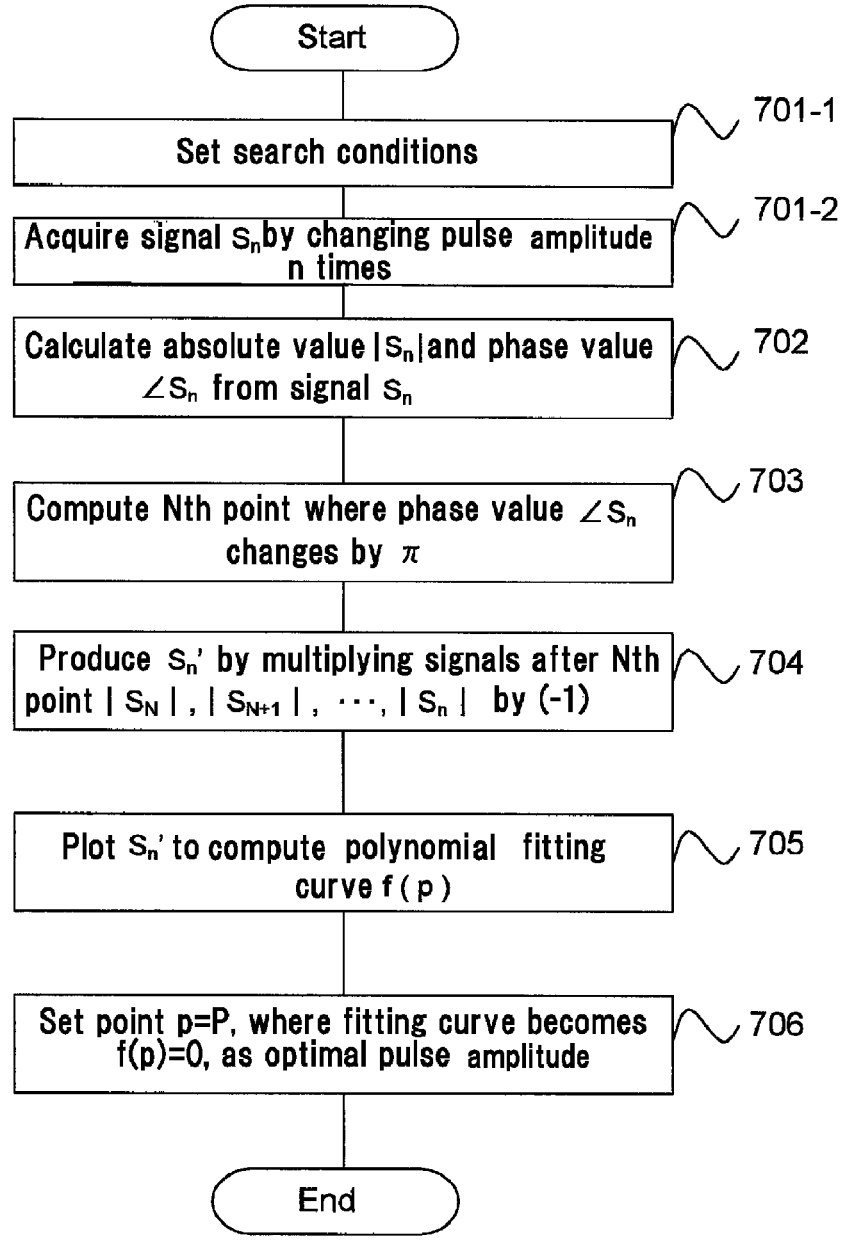

[Figure 8]
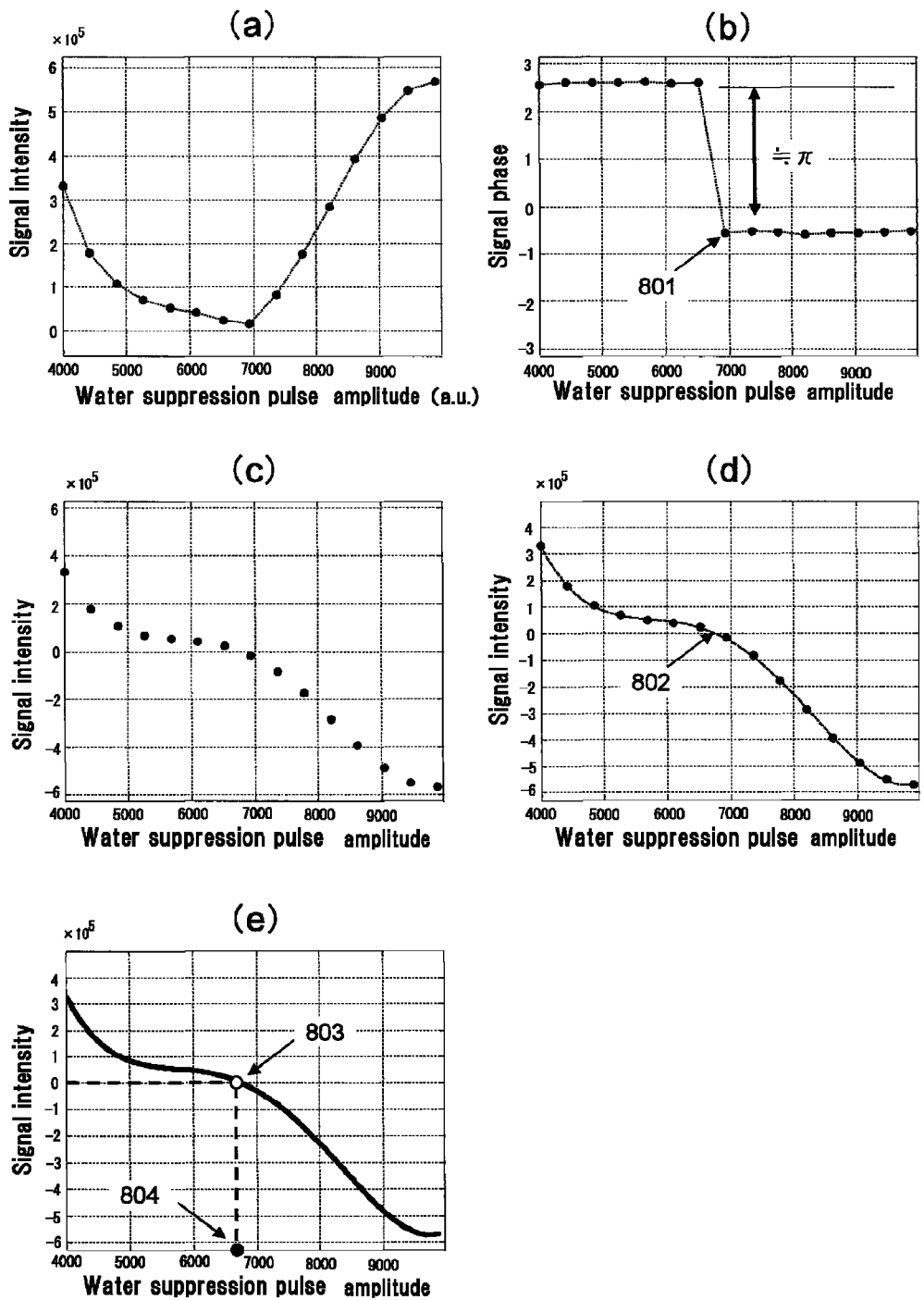

[Figure 9]
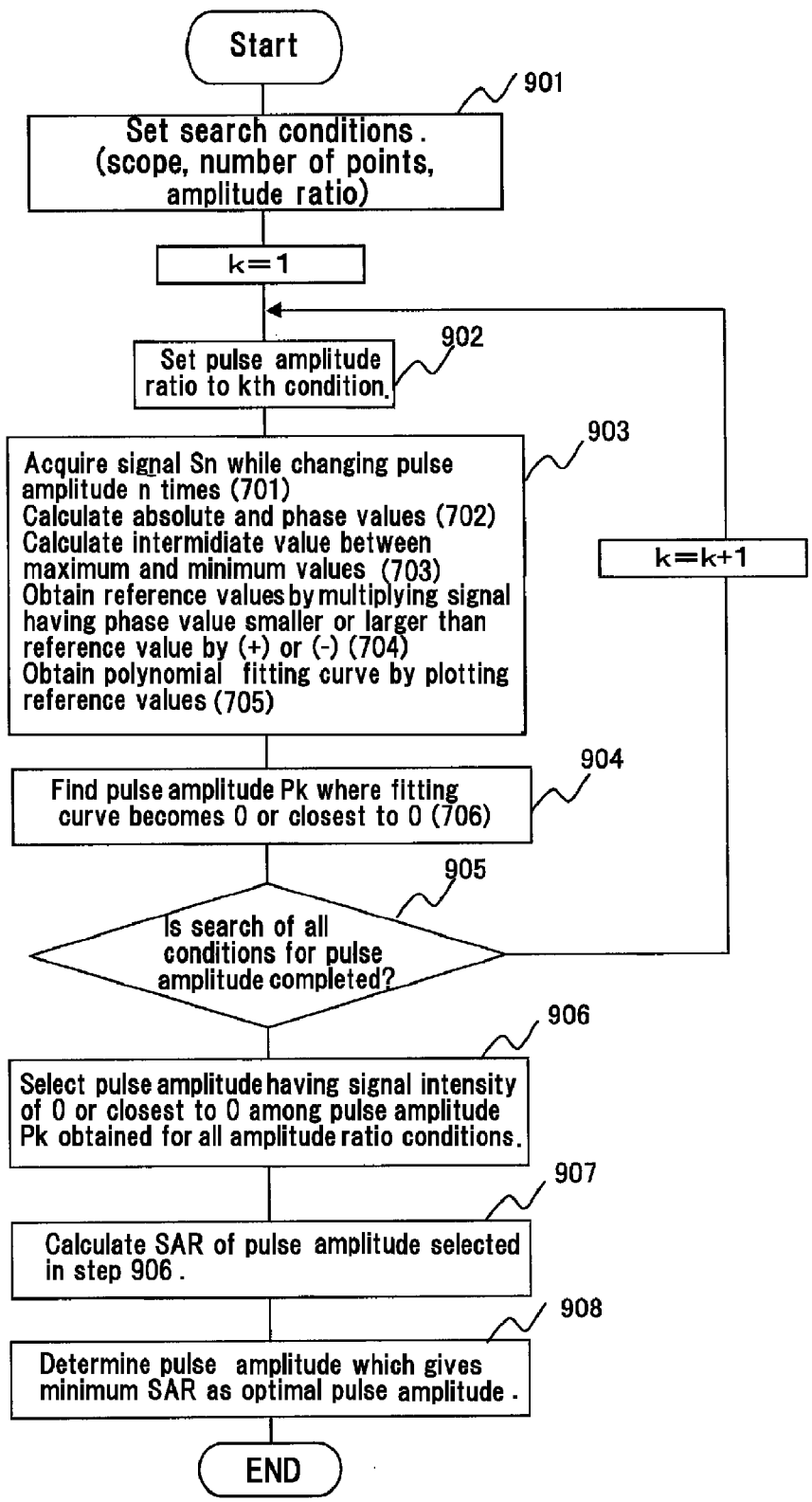

[Figure 10]
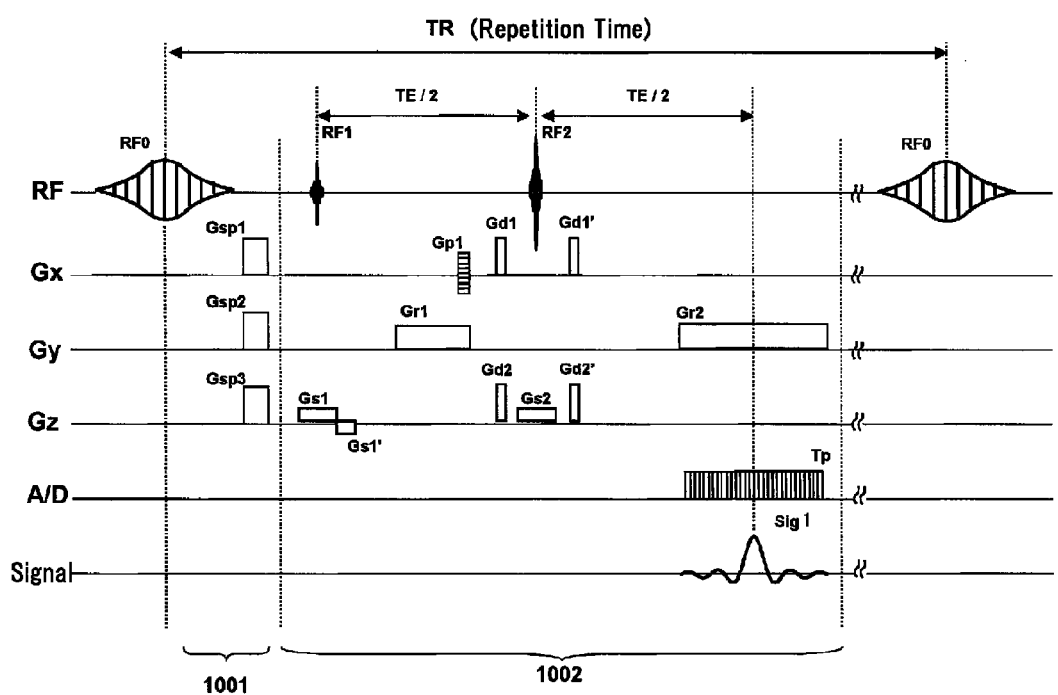

[Figure 11]
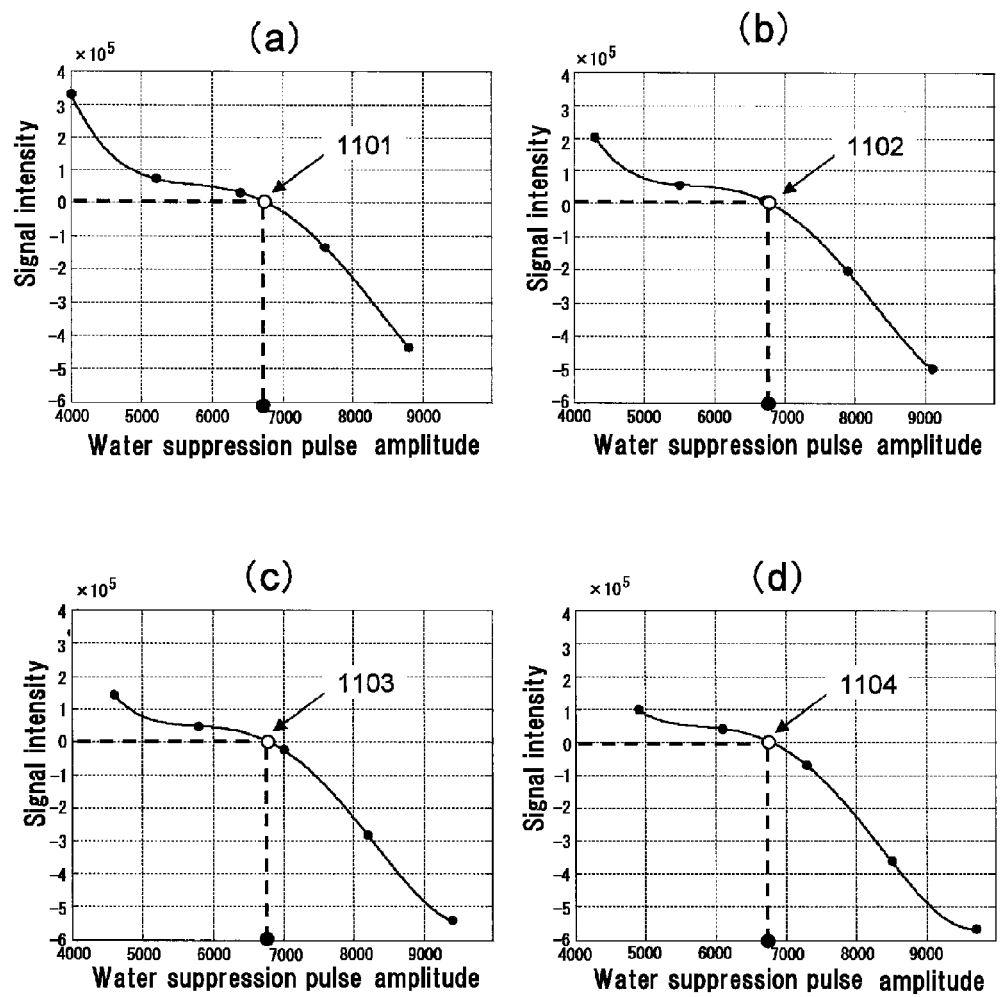

[Figure 12]
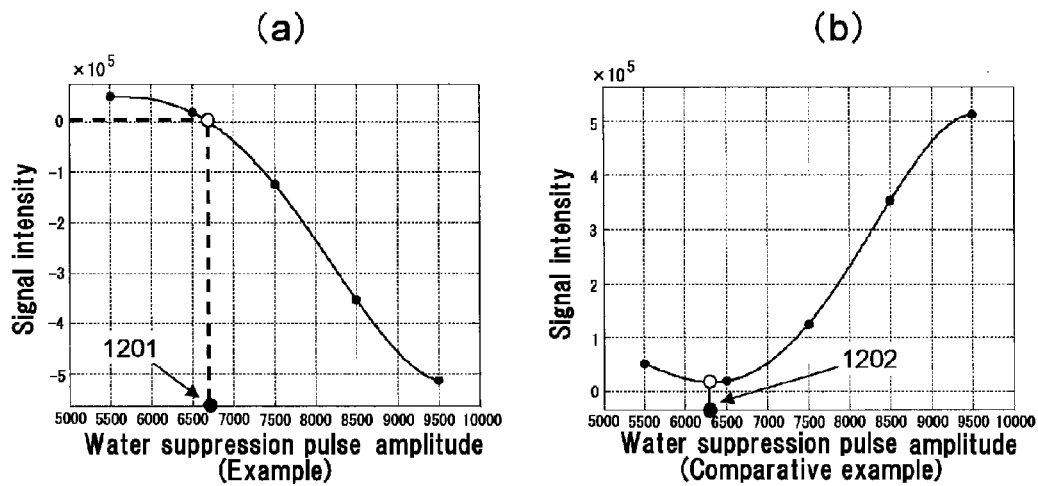
[Figure 13]
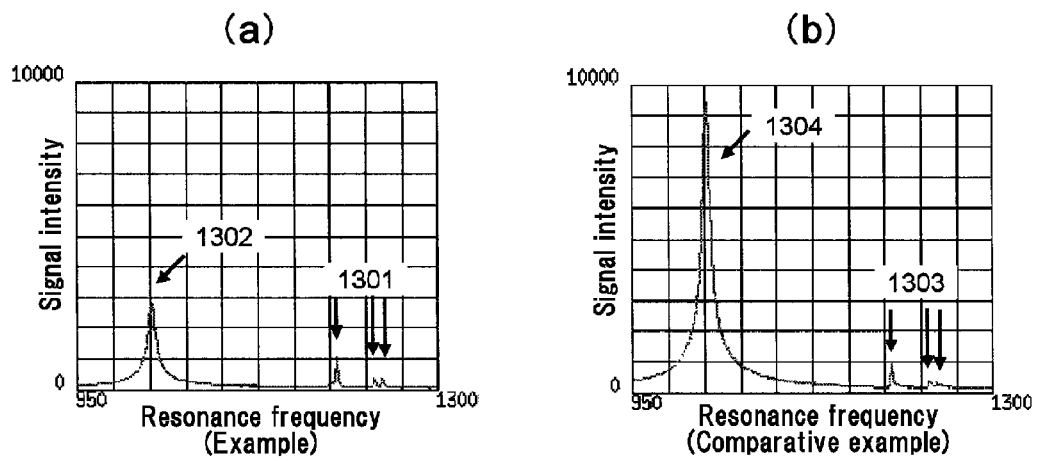

[Figure 14]
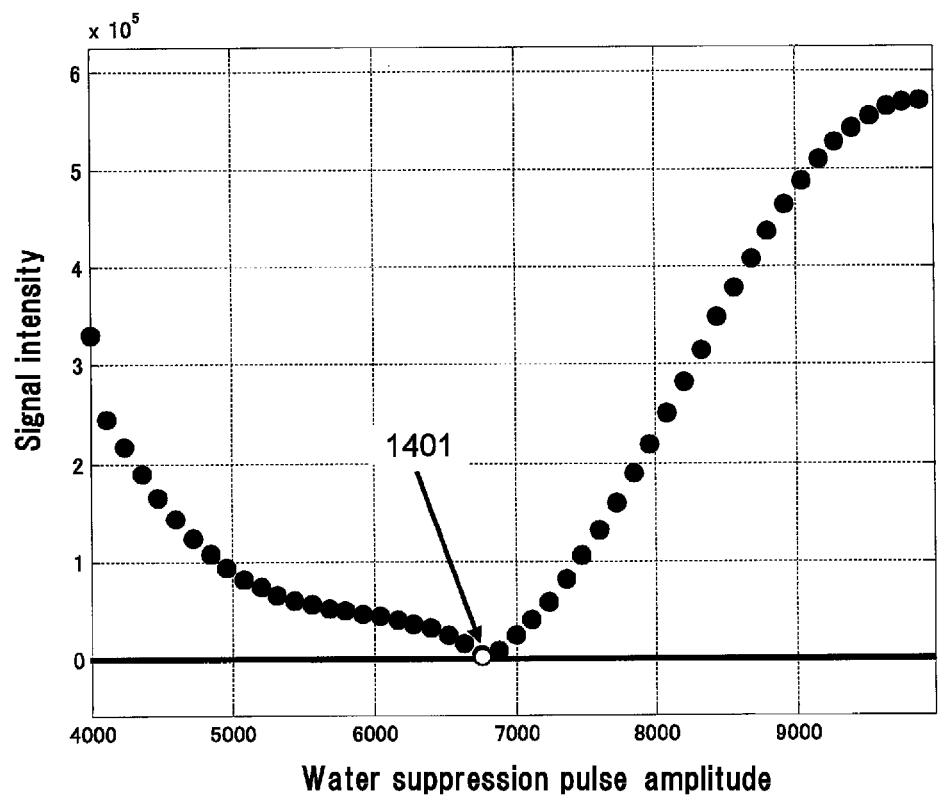

[Figure 15]
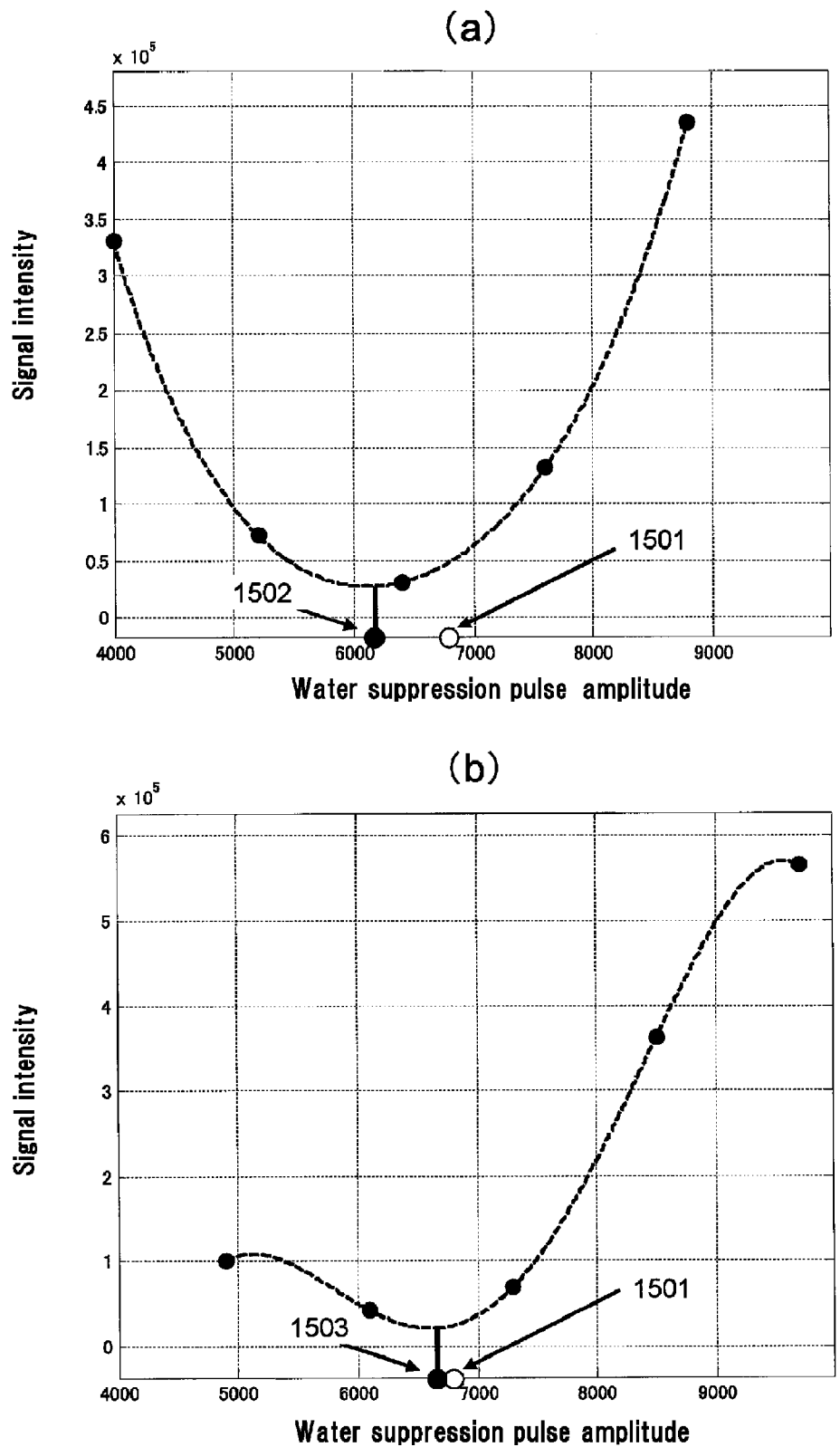

[Figure 16]
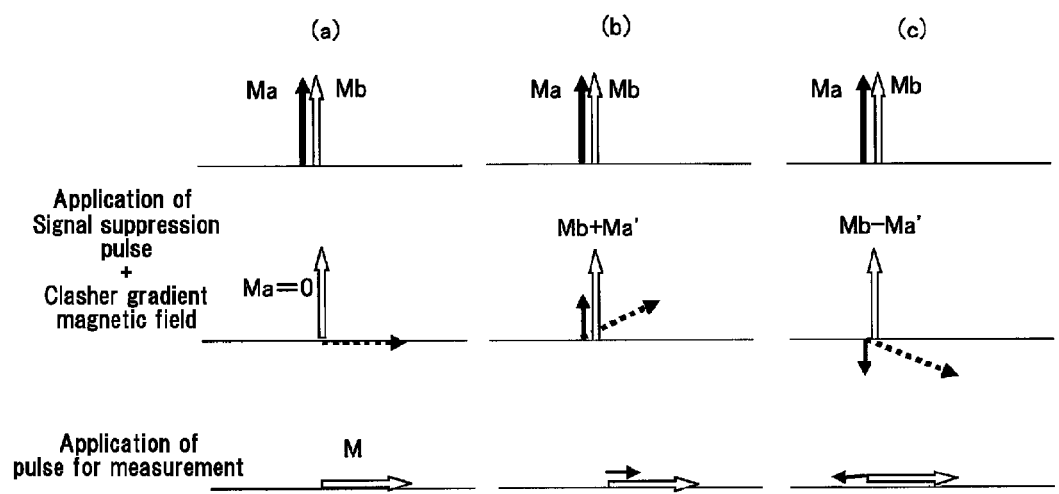

NUCLEAR MAGNETIC RESONANCE IMAGING APPARATUS

TECHNICAL FIELD

The present invention relates to a nuclear magnetic resonance imaging apparatus (referred to MRI apparatus hereinafter) and a method. In particular, it relates to a method of adjusting amplitude of signal-suppression pulse for suppressing signals generated from non-objective substances.

BACKGROUND ART

Due to difference in molecular structure, chemical shift phenomenon is observed in nuclear magnetic resonance signals measured by MRI, where the resonance frequencies are slightly changed. As a method of utilizing this phenomenon, MRS (Magnetic Resonance Spectroscopy) which separates nuclear magnetic resonance signals to obtains spectra of each metabolite, and MRSI (Magnetic Resonance Spectroscopic Imaging) which visualizes spatial signal intensity distribution for each metabolite have bee known in the art.

Typical metabolites of human body which can be detected by MRS or MRSI include choline, creatine, N-acetyl aspartic acid, lactic acid and so on. By using the amount of these metabolites, development of metabolic abnormality diseases such as cancer etc. can be judged and early-stage diagnosis becomes practicable. Further, it becomes possible to conduct diagnosis of malignancy of tumor without imparting damage to human body.

Since NMR signals of metabolites in human body have an intensity of about $\frac{1}{1000}$ of water molecules in human body, they are embedded in water signals and generally cannot be detected. In order to measure signals of the metabolites, there has been proposed a method of suppressing unnecessary signals of water or fat. For example, in a technique disclosed in Patent Document 1, unnecessary signals are suppressed beforehand using a pulse having a frequency band similar to that of unnecessary signals so that the metabolites signals residing in periphery of water signal peek are detect. Such a method of suppressing signals by pseudo saturation of frequency region including resonance frequency of the unnecessary signals is called CHESS (CHEmical Shift Selective).
Patent Document 1: Japanese Patent Application Publication No. S60-168071

In the CHESS, while a single pulse (CHESS pulse) may be used for pseudo saturation, three pulses are generally used in combination with spoiler gradient magnetic fields of three axis directions. In order to sufficiently suppress water signals to keep metabolites from embedded in water signals in CHESS, it is important to irradiate the CHESS pulse with an appropriate amplitude (flip angle). Examples of a method for adjusting the appropriate pulse amplitude are as follows:
(1) Manual adjustment by user
(2) Semi-auto adjustment where a user determines an optimal value from the result of auto-measurement.
(3) Full-auto adjustment where both measurement and determination are automated.

In addition, the full-auto adjustment includes, as a typical methods thereof, all-point searching and absolute value fitting.

DISCLOSURE OF INVENTION

Problem to be Solved by Invention

With regard to the full-auto adjustment, as shown in FIG. 14, the all-point searching obtains signal absolute values within a predetermined pulse-amplitude range while finely changing the pulse amplitude of three pulses at the same time and finds a pulse amplitude 1401 which makes the signal absolute values smallest. The absolute value fitting, as shown in FIGS. 15(a) and (b), obtains signal absolute values while roughly changing the pulse amplitude of three pulses at the same time and performs polynomial fitting on plotted points of the signal absolute values versus pulse amplitude to find the smallest value of the computed fitting curve. The smallest value is set as the optimal pulse amplitude.

Among the aforementioned methods of adjusting the optimal pulse amplitude, manual or semi-auto adjustment imparts a technical burden to user and requires increased time for adjustment. The technical burden of the user can be made small by using the full-auto adjustment. However, there is a general problem that the optimal pulse amplitude varies depending on the object, region, parameter of the measurement and thereby precision of suppression scatters (is unstable). In order to reduce the scattering of precision, the searching range of the pulse amplitude should be wide and measurement should be done finely in the all-point searching. This invites long adjustment time.

In the absolute value fitting, the precision of the optimal pulse amplitude found from the fitting curve largely depends on the precision of fitting. For example, both FIGS. 5 (a) and (b) show the result of experiments of finding the optimal pulse amplitude using the absolute value fitting, where the number of measurement points is 5 but the searching positions are different between (a) and (b). In the figures, 1501 indicates the optimal pulse amplitude found from the measured value, and 1502 and 1503 respectively indicate the smallest values found by fitting with different searching position of the five measurement points. It is understood from the figures that the precision of fitting changes depends on the searching positions. Thus, the absolute value fitting has a problem that water signals may not be suppressed stably. In order to improve the precision of fitting, the measurement points should be increased and high degree fitting is required. For example, the pulse amplitude adjustment can be made more stable if the number of the measurement points is increased to nine or more and fitting of eight or more degree is performed. However, such increase in the number of the measurement points invites elongation of the adjusting time.

As explained above, the full-auto adjustment necessitates a long adjusting time to improve the precision and, as the result, overall measurement time including setting or conditioning of a subject and a main measurement increases and improvement of throughput is hindered.

The present invention aims at providing an MRI apparatus and method which enable to find an optimal suppression pulse at high precision with a short adjusting time, and improving throughput of MRI measurement.

Means for Solving the Problems

In the present invention, signals are acquired while changing the amplitude of signal suppression pulse and the signal absolute values and the signal phase values are calculated. Optimal pulse amplitude is calculated based on the absolute values and the phase values. Specifically, reference signals are calculated by polarizing (allocating a sign to) the absolute value for each signal based on the phase value. Polynomial fitting is applied to the reference signals and the value where the fitting curve becomes 0 or closest to 0 is set as the optimal pulse amplitude. Accuracy of fitting can be improved stably with a small number of measurement points. Accordingly, an optimal pulse amplitude, which can sufficiently suppress unnecessary signals, can be determined swiftly, accurately and stably.

Specifically, an MRI apparatus of the invention comprises; an imaging means having a gradient magnetic field applying means for applying gradient magnetic field to a subject placed in a magnetic static field space, a high-frequency magnetic field radiating means for radiating a high-frequency magnetic field to the subject and a receiving means for receiving nuclear magnetic resonance signals generated from the subject, sequence control means for controlling said imaging means to implement a signal suppression pulse sequence including at least one radiation of high-frequency magnetic field for suppressing a signal generated from a predetermined atomic nuclei, and pulse amplitude adjusting means for adjusting the amplitude of the high-frequency magnetic field pulse used by the signal suppression pulse sequence. And the pulse amplitude adjusting means computes optimal pulse amplitude based on absolute values and phase values of multiple nuclear magnetic resonance signals obtained by implementing the signal suppression pulse sequence under multiple conditions of different pulse amplitude. Specifically, the pulse amplitude adjusting means comprises a signal value calculation means for calculating a singed signal value (reference signal) from the signal absolute values and the signal phase values of multiple signals obtained by implementing the sequence under different conditions of the pulse amplitude, and an optimal pulse amplitude calculation means for calculating an optimal pulse amplitude used in the signal suppression pulse sequence based on the signed signal value.

According to the MRI apparatus of the invention, the pulse amplitude adjusting means, for example, is provided with an approximate curve computation part, which obtains an approximate curve by plotting the signed signal values against the amplitude of high-frequency magnetic field pulse, and the optimal pulse amplitude calculation means obtains the amplitude of high-frequency magnetic field pulse, with which the value of approximate curve computed in the approximate curve computation part becomes 0 or closest to 0, as the optimal pulse amplitude.

According to the MRI apparatus of the invention, the signal value calculation means calculates an intermediate value between the maximum and minimum phase values, and gives a positive sign to one and a negative sign to the other of the signal absolute values corresponding to the phase value smaller than the intermediate value and the signal absolute value corresponding to the phase value larger than the intermediate value.

According to the MRI apparatus of the invention, a single or multiple (for example three) high-frequency pulses may be irradiated in one signal suppression pulse sequence and the signal amplitude may be the same or different in the multiple pulses. When the multiple pulses have different amplitude, the pulse amplitude adjusting means calculates the optimal pulse amplitude for each combination of the multiple high-frequency pulses having different amplitude.

The present invention may be applied to MRI apparatuses that implement a signal suppression pulse sequence followed by a main measurement pulse sequence such as MRS, MRIS, MRI and so forth.

Effect of Invention

The principle of the invention will be explained with the reference of FIG. 16. For simplifying the explanation, a single signal suppression high-frequency pulse (referred as signal suppression pulse hereinafter) is applied in a signal suppression pulse sequence. Longitudinal relaxation is put on the side. FIG. 16 (a) shows the case where the magnetization Ma of atomic nucleus, which is unnecessary for measurement, becomes zero by signal suppression. (b) and (c) show the case where the magnetization Ma of the unnecessary nucleus is not zero due to smaller or larger signal suppression pulse than that of (a).

Specifically, in Figure (a), Ma becomes zero by irradiating a signal suppression pulse and diphasing gradient magnetic field (clasher magnetic field) just before excitation of magnetization Mb of atomic nucleus, i.e., subject of main measurement. The amplitude of the suppression pulse which makes the above-state is the most appropriate (optimal) amplitude. On the other hand, as shown in Figure (b), when the amplitude of the signal suppression pulse is not enough, the component of Ma in the (+) direction remains even after application of the clasher. As the result, the unnecessary magnetization Ma' is also excited by the exciting pulse for measurement as well as the magnetization Mb. Meanwhile, as shown Figure (b), when the amplitude of signal suppression pulse is large, the component of Ma in the (−) direction remains and the unnecessary magnetization Ma' is excited by the exciting pulse for measurement to have a phase opposite to the magnetization Mb.

It is understood from the above that the phase of Ma' excited by the measurement exciting pulse after signal suppression differs by about 180° ($\pi$) before and after the optimal signal pulse amplitude. This phase change is remarkably sharp compared to the change in the signal absolute value and, therefore, can be searched from information of several points surrounding the change point.

The present invention uses the phase value in addition to the signal absolute value to find the optimal pulse amplitude and, therefore, the most appropriate pulse amplitude which enables sufficient suppression of the unnecessary signals can be determined quickly, accurately and stably. As the result, unnecessary signals for detection of metabolites can be suppressed to improve performance of diagnosis. In addition, a whole measurement time including setting or conditioning of a subject and implementation of a main measurement can be shortened to improve throughput of MRSI.

BEST MODE FOR CARRYING OUT THE INVENTION

Embodiments of MRI Apparatus of the present invention will be explained below with the reference of the attached drawings.

This invention relates to the optimization of the amplitude of high-frequency magnetic field pulse in the MRI apparatus, and is applicable to the MRI apparatus of all structures and types. FIGS. 1 (a)-(c) illustrate overall configuration and appearance of the nuclear magnetic resonance imaging (MRI) apparatus to which this invention is applied. FIG. 1 (a) is a horizontal magnetic field MRI apparatus using a tunnel magnet that generates a static magnetic field by using a solenoid coil. FIG. 1 (b) is a vertical magnetic field MRI apparatus of hamburger (open) type in which the magnets are placed apart (one above the other) to provide subjects (patients) with a feeling of openness. FIG. 1 (c) is a tunnel type MIR apparatus similar to the one shown in FIG. 1 (a). However, it realizes improved the feeling of openness by shortening the depth of the magnet and tilting it. The present invention is applicable to the MRI apparatuses with publicly known structure, including the above mentioned MRI apparatuses.

An example of configuration of the MRI apparatus to which the present invention is applied is shown in FIG. 2.

In this MRI apparatus, a space, in which a subject is placed, is equipped with a static magnetic field coil 2, which generates a static magnetic field, a gradient magnetic field coli 3, which gives gradient to the static magnetic field in the three orthogonal directions, a high-frequency coil 5 for measurement (hereinafter transmission coil), which irradiates high frequency magnetic field on the region of measurement of the subject 1 and a high-frequency coil 6 for reception (hereinafter reception coil), which receives nuclear magnetic resonance signals generating from the subject 1. The MRI apparatus may have a shim coil 4 that is able to adjust the uniformity of the static magnetic field.

The static magnetic field coil 2 with various structures can be adopted according to the structure of the apparatus shown in FIG. 1. The gradient magnetic field coil 3 and the shim coil 4 are driven by a power unit for gradient magnetic field 12 and a power unit for shim coil 13, respectively. FIG. 2 shows the transmission coil and the reception coil, separately, but there is a configuration, in which one high-frequency coil can be used for both transmission and reception. The high-frequency magnetic field irradiated by the transmission coil 5 is generated by a transmitter 7. The nuclear magnetic resonance signals detected by the reception coil are transmitted through a receiver 8 to a calculator 9.

The calculator 9 performs various types of arithmetic processing for nuclear magnetic resonance signals and generates spectral information and image information. The abovementioned arithmetic processing includes corrective processing of nuclear magnetic resonance signals.

The calculator 9 also carries out calculation to decide the optimal amplitude of signal suppression high-frequency magnetic field pulse which is generated by the transmitter 7. The determination of the optimal amplitude of signal suppression high-frequency magnetic field pulse will be explained in detail later. While the calculation for determining the optimal pulse amplitude is to be carried out by the calculator 9 according to this embodiment, it may be carried out also by other calculator that is an external device of the MRI apparatus.

To the calculator 9 a display 10, a memory device 11, a sequence controller 14 that is the abovementioned control means, an input device 15, and others are connected. The abovementioned spectral and image information are displayed on the display 10 and recorded in the memory device 11. The input device 15 inputs conditions of measurement and other conditions necessary for arithmetic processing, and these conditions of measurement, etc. are also recorded in the memory device 11, as it is deemed required.

The sequence controller 14 controls a power supply part 12 for driving the gradient magnetic field generating coil 3, a power supply unit 13 for driving the shim coil 4, the transmitter 7 and the receiver 8. The control time chart (pulse sequence) is set in advance according to the method of imaging, and is stored in the memory device 11.

The pulse sequence which is implemented in the MRI apparatus of the present invention is explained. According to this embodiment, the pulse sequence in CHESS method (hereinafter CHESS sequence), which suppresses water signals and the MRSI pulse sequence, which images metabolic substances under water signal suppression are implemented.

An example of the pulse sequence of the main MRSI measurement is shown in FIG. 3, in which RF indicates the timing to apply the high-frequency magnetic field pulse. Gx, Gy and Gz indicate the timing when the gradient magnetic field pulse in the direction of x, y and z is applied, respectively. A/D indicates the signal measurement period. The pulse sequence shown in FIG. 3 is the same as a publicly known MRSI pulse sequence. In this pulse sequence, one exciting pulse RF1 and two reversing pulses, rRF2 and fRF3, are used to selectively excite a given region of interest, and obtains FID (free induction decay) signals from the region of interest. FIG. 4 shows the region to be excited by this pulse sequence.

Action of the pulse sequence in FIG. 3 is explained briefly by using FIG. 4.

Firstly, the cross-section 401 in z-direction is excited by applying the high-frequency magnetic field RF1 and the gradient magnetic field pulses Gs1 and Gs1'. Then, the high-frequency magnetic field RF2 and the gradient magnetic field Gs2 are applied at TE/4, where TE is echo time. As a result, only the nuclear magnetization in the region where the cross-section 401 in z-direction and the cross-section 402 in y-direction are intersect, are rephased. Then the high-frequency magnetic field RF3 and the gradient magnetic field pulses Gs3 are applied after the time of TE/2 following the application of the high-frequency magnetic field, RF2. This rephases the nuclear magnetization only in the region of interest 404, where the cross-section 401 in z-direction, the cross-section 402 in y-direction and the cross-section 403 in x-direction intersect, and thereby measures the free induction decay signal FID1. In addition, Gd1~Gd4 and Gd1'~Gd4' are the gradient magnetic fields, which are to dephase the phase of nuclear magnetization excited by RF2 and RF3, without disturbing the phase of nuclear magnetization exited by the high-frequency magnetic field RF1. Between the high-frequency magnetic field RF1 and the high-frequency magnetic field RF2, the phase encoding gradient magnetic fields Gp1 and Gp2 are applied. By changing the amplitude of such phase encoding gradient magnetic fields in every excitation, location information can be given to the nuclear magnetic resonance signals to be generated from the region of interest, 404. By applying the Fourier transform to these measured nuclear magnetic resonance signals FID1, an image of distribution of various metabolic substances contained in the region of interest 404 can be obtained, as shown in FIG. 4.

The CHESS sequence is implemented, in order to reduce unnecessary water signals, prior to the above mentioned pulse sequence of the MRSI's main measurement part. FIG. 5 shows an example of CHESS sequence which is often used in the MRSI. In the CHESS sequence, Gaussian pulses, RFC1-RFC3, with narrowed excitation bandwidth (approximately 1.0 ppm) is irradiated, with water resonance frequency as a central frequency, to excite only nuclear magnetization contained in water. After each pulse irradiation, spoiler gradient magnetic field in either x-, y- or z-direction, Gsp1-Gsp3, is applied. By implementing such pulse sequence, only the nuclear magnetization contained in water can be saturated to be suppressed (pseudo saturation). Usually, as illustrated, a set of Gaussian pulse and spoiler magnet field is repeated for about three times, in order to raise the water suppression rate.

In the main MRSI measurement, it is important to adjust properly the amplitude of signal suppression pulse to be used in this CHESS sequence in order to obtain a distribution image of metabolic substances by reducing unnecessary water signals. In the MRI apparatus according to the present embodiment, the amplitude of signal suppression pulse to be used in the CHESS sequence is optimized prior to the main measurement as explained in detail below.

A configuration example of means to optimize the amplitude of signal suppression pulse is shown in FIG. 6. According to the present embodiment, optimization of the amplitude of signal suppression pulse is realized mainly by the sequence controller 14, and the calculator 9 of the MRI apparatus shown in FIG. 2. The calculator 9 comprises, as a means to optimize the pulse amplitude, a search condition setting part 61, signal value calculation part 62, signal value calculation part 62, reference value calculation part 63, approximate curve computation part 64, optimal pulse amplitude calculation part 65 and optimal pulse amplitude setting part 66. All of them are built in as a series of programs in the calculator 9.

The search condition setting part 61 set the scope of search (scope of variable pulse amplitude), which has been set as a default or set by user via the input device 15 and the number of search points (the number of measurement points within a set scope of search), and gives it to the sequence controller 14, which implements the pulse sequence for search.

The signal value calculation part 62 calculates absolute and phase values of signal intensity from the signals obtained by the pulse sequence for search. The reference value calculation part 63 obtains the reference value by adding a sign to the absolute values using a phase value of the signal intensity.

The approximate curve computation part 64 computes an approximate curve by applying the functional fitting to the curve drawn by plotting reference values against the pulse amplitude. The optimal pulse amplitude calculation part 65 calculates a minimum reference value from the above mentioned approximate curve, and sets the pulse amplitude giving a minimum value as the optimal pulse amplitude. The optimal pulse amplitude setting part 66 sets the thus computed optimal pulse amplitude in the CHESS sequence of the sequence controller 14.

Then, with reference to FIGS. 7 and 8, the way how to set the amplitude of signal suppression pulse is explained.

First of all, the search condition setting part 61 sets the search conditions (the scope of search and the number of search points) for the amplitude of signal suppression pulse of the CHESS sequence in the sequence controller 14. The scope of search set by the scope of search setting part 61 should include the optimal pulse amplitude. For example, by using the pulse amplitude of 90 degree which has been preliminarily set as a standard value, the values smaller than this standard is set as the initial value of the scope of search. Instead of 90 degree, the value which has been adjusted and retained for each transmission coil and site can be used as the standard value. On the other hand, the value which is larger than the optimal pulse amplitude estimated from experience, etc., and smaller than the pulse amplitude of 180 degree, is used as a terminal value of the scope of search (Step 701-1). The number of search points can be several, or 5 points, for example, given the scope of search is set so as to contain the optimal pulse amplitude.

The sequence controller 14 implements the CHESS sequence under the search conditions set by the search condition setting part 61 and acquires signals. In the acquisition of signals, FID or echo signals are measured by applying exciting high-frequency magnetic field pulse of main measurement after the CHESS sequence, for example. Such measurement is conducted by changing the amplitude of signal suppression pulse for n times to acquire multiple signals Sn (Step 701-2). At this measurement, the signal suppression pulse is irradiated at least once in the CHESS sequence. According to the present embodiment, like the CHESS sequence in the main measurement, the signal suppression pulse with the same amplitude is irradiated for three times to acquire signals.

Then, at the signal calculation part 62, signal absolute value |Sn| and Signal phase value ∠Sn are computed separately from multiple signals Sn acquired in Step 701-2 (Step 702). FIGS. 8 (a) and (b) are the graphs in which signal absolute value |Sn| and Signal phase value ∠Sn are plotted against the amplitude of signal suppression pulse, respectively. As seen in FIG. 8, the signal phase value ∠Sn shows a discontinuous change at certain pulse amplitude.

The signal value calculation part 62 determines the Nth point, where this signal phase value ∠Sn undergoes a discontinuous change, namely the amount of change is π or more or close to π (step 703). Point 801 in FIG. 8 (b) is the Nth point to be acquired.

The reference value calculation part 63 determines Sn', which is a signed (polarized) value obtained by multiplying the absolute value of each signal acquired before the nth point, |S1|, |S2|, . . . , |SN−1| by (+1) and the absolute value of each signal acquired on and after the nth point, |SN|, |SN+1|, . . . , |Sn| by (−1). This Sn' is used as a reference value (Step 704). FIG. 8(c) shows a diagram where the reference values Sn' are plotted against the amplitude of water suppression pulse. Polarization may be conducted by multiplying the signals before the nth point, namely |S1|, |S2|, . . . , |SN−1| by (−1).

Alternately, instead of determining the point, on which the amount of change is π or more or closed to π, the signal value calculation part 62 may calculate an intermediate value between the maximum and minimal phase values, and a positive or negative sign is added to the absolute value of the signal corresponding to the phase value smaller than the intermediate value and an opposite sign (negative or positive, respectively) is added to the absolute value of the signal corresponding to the phase value larger than the intermediate value at the reference value calculation part 63.

Next, an approximate curve (fitting curve), f(p), is computed by applying polynomial fitting to the plotted Sn' at the approximate curve computation part 64 (Step 705). An example of the fitting curve 802 obtained by the 4th fitting is shown in FIG. 8 (d). The fitting curve can be computed by using various fitting methods, including the fitting by changing parameters of a model function.

Finally, the optimal pulse amplitude calculation part 65 computes the point, p=P (FIG. 8 (e) (804)), where the computed fitting curve f(p) is 0 or closest to 0 (FIG. 8 (e) (803)). In the computation of P, the point which corresponds to the minimum absolute value of fitting curve |f(p)| may be assumed as the optimal pulse amplitude P.

The pulse amplitude setting part 66 sets the abovementioned value P as the optimal pulse amplitude (Step 706). By using the thus set optimal pulse amplitude P, main MRSI measurement accompanied by the CHESS sequence is conducted.

According to the present embodiment, since the pulse amplitude which gives the minimum signal value is determined by using not only absolute values of signal intensity but also phase value, the amplitude of suppression pulse can be highly-precisely determined with fewer search points. This enables sufficient suppression of signals unnecessary for the detection of metabolite substance in the main MRSI measurement, thereby enhancing diagnostic ability. According to the present embodiment, the time required for optimizing the pulse can be dramatically shortened without bothering users. This, as a consequence, can shorten the overall measurement time, including setting and conditioning of the subject and main measurement, and contribute to the improved throughput of MRSI measurement.

Abovementioned embodiments have explained the cases, in which the signal suppression pulse is irradiated for 3 times in the CHESS sequence, with the pulse amplitude being equal for three times, namely the ratio of amplitude being 1:1:1. However, the ratio of pulse amplitude for three times of irradiation may be changed to the different ratio. FIG. 9 explains an example of procedures applicable when the amplitude of multiple pulses is different. Even in the embodiment shown in FIG. 9, the means to optimize the signal suppression pulse amplitude can be configured as shown in FIG. 6. However, the search condition setting part 61 sets search conditions including the ratio of pulse amplitude for the first, second and third time of irradiation, as well as the scope of search and the number of search points, the search is conducted with changed ratio of pulse amplitude.

Procedures in FIG. 9 are explained below. Firstly, at the search conditions setting part 61, the scope of search, the number of search points and the ratio of pulse amplitude are set (Step 901). Following the setting of pulse amplitude ratio at one condition (Step 902), similar steps to Steps 701-706 in FIG. 7 are applied to obtain the optimum pulse amplitude in the set pulse amplitude ratio (Steps 903 and 904). Namely, the pulse sequence is implemented for the previously set scope of search for the set number of search points to acquire the signals, Sn (701). After computing absolute and phase values of the acquired signals (702), computing the intermediate value between the maximum and minimum phase values (703), multiplying the absolute value of signal corresponding to the phase values smaller than the intermediate value by [+] and multiplying the absolute value of signal corresponding to the phase values larger than the intermediate value by [−], a polynomial fitting curve (705) is computed by plotting the signal values for the pulse amplitude (the amplitude of the pulse used as reference among three pulses). The pulse amplitude on the point, where the value of this fitting curve is zero or closest to zero, is assumed as an optimum pulse amplitude at the set ratio of pulse amplitude.

After the implementation of abovementioned steps 902-904 for all pulse amplitude ratios set in Step 901 (Step 905), among all optimal pulse amplitude calculated for all pulse amplitude ratios, the amplitude whose value of fitting curve (signal value) is zero or closest to zero (Step 906) is chosen. If more than one optimal pulse amplitude (under the conditions of different pulse amplitude ratios) are chosen at Step 906, SAR for each of these optimal pulse amplitude is calculated (Step 907) and the amplitude with lowest SAR is assumed as the optimal pulse amplitude (Step 908). If only one optimal pulse amplitude is chosen at Step 906, it is assumed as the optimal pulse amplitude. The optimal pulse amplitude thus computed finally is set at the CHESS sequence for the main measurement of the sequence controller 14.

According to this embodiment, when the signal suppression pulse is irradiated for several times, any combination of irradiation, including the ratio of amplitude that may have the greatest signal suppression effect may be chosen.

Next, the embodiment in which the present invention is applied to the fat suppression MRI is explained. FIG. 10 shows an example of pulse sequence to be applied in this embodiment. This pulse sequence is identical with the publicly known fat suppression spin echo pulse sequence. In FIG. 10, RF indicates the timing to apply high-frequency magnetic field pulse, where Gx, Gy and Gz indicate the timing to apply gradient magnetic pulse in direction of x, y and z, respectively. A/D indicates the period of signal measurement.

The pulse sequence combining a fat suppression part 1001 and a main measurement part 1002 is implemented in the present embodiment as in the abovementioned embodiment. However, according to the present embodiment, the fat suppression part 1001 uses a broad band high-frequency magnetic field pulse RF0 as a signal suppression pulse, and the pulse is irradiated once. In addition, the main measurement part 1002 consists of the pulse sequence of MRI, specifically the spin echo pulse sequence here. In this pulse sequence, spin echo signal, Sig1, is acquired from the cross-section perpendicular to the z-axis. This cross-section is the plane excited by the use of exciting pulse RF1 and reversing pulse RF2.

Action of the pulse sequence is briefly explained with FIG. 10. Firstly, broad-band high-frequency magnetic field pulse for fat suppression is irradiated at the optimal pulse amplitude to excite only unnecessary fat signals. Then, by applying gradient magnetic field pulses Gsp1-Gsp3 and dephasing the excited fat signals, fat signals are made to disappear.

At the main measurement part 1002, the high-frequency magnetic field, RF1, and the gradient magnetic field pulse, Gs1 and Gs1', are applied to excite the cross-section perpendicular to the z-direction. This is followed after TE/2 hours by the application of high-frequency magnetic field RF2 and gradient magnetic field Gs2. As a result, only the nuclear magnetization on the same cross-section as mentioned above is rephrased and the spin echo signal Sig1 is measured. The gradient magnetic fields, Gd1, Gd1 and Gd1, Gd2', do not dephase the nuclear magnetization excited by the high-frequency magnetic field, RF1, but dephase only the nuclear magnetization excited by RF2.

Before acquiring the spin echo signal, Sig1, the phase encoding gradient magnetic field, Gp1, in x-direction is applied. By changing this Gp1 amplitude at every excitement, location information in x-direction is given to the nuclear magnetic resonance signal generated from the excited plane. The dephase gradient magnetic field, Gr1, and the frequency encoding gradient magnetic field, Gr2, are also applied in y-direction, and location information in y-direction is given to the nuclear magnetic resonance signal generated from the excited plane at every excitement. The spin echo signals (Sig1) which is thus given local information are subjected to Fourier transform. As a result, MRI images with suppressed fat signals can be obtained.

Also in the present embodiment, prior to the main MRI measurement with the abovementioned pulse sequence, the pulse amplitude of high-frequency magnetic field pulse, RF0, to be used in the fat suppression part 1001 is optimized. The procedure for optimization is identical with that shown in FIG. 7. Namely, the pulse sequence of the fat suppression part 1001 is implemented under the search conditions set by the search scope setting part 61 to acquire multiple signals. Then, the absolute and phase values of the signal intensity are computed at the signal amplitude calculation part 62, and the signal value (reference value) which is signed based on the phase value is computed at the reference value calculation part 63. Then at the approximate curve computation part 64, the reference value is plotted against pulse amplitude, and the approximate curve is obtained by polynomial fitting. Finally, at the optimal pulse amplitude calculation part 65, the pulse amplitude at the point on this approximate curve, where the reference value is 0 or closest to 0, is obtained as an optimal pulse amplitude, and set in the sequence controller 14.

The embodiments, in which the present invention is applied to the water suppression MRSI and the fat suppression MRI, have been explained. However, the present invention can be applied not only to MRSI and MRI, but also to MRS, as far as the measurement involves CHESS sequence. It is needless to say that the present invention can be applied not only for water signals or fat signals, but also to the signal suppression of any substance by using the pulse with appropriate bandwidth as signal suppression pulse. Moreover, the present invention can be applied to the diffusion-weighted pulse sequence as shown in the non-patent document 1 shown below. For example, by applying the present invention to the technology shown in the non-patent document 1, signals of subcutaneous fat present throughout the body can be removed effectively, so that the diffusion-weighted image with high diagnostic performance can be acquired.

Non-patent document 1: Radiation Medicine, Vol. 22, 2004, pages 275-282

In the above embodiments, the cases, in which the pulse amplitude optimization functions in the present invention are implemented mainly in the calculator and the sequence controller of the MRI apparatus, have been explained. Among pulse amplitude optimization functions, the functions of the signal value calculation part, reference value calculation part, approximate curve computation part and optimal pulse amplitude calculation part can be implemented in a calculator installed independently from the MRI apparatus.

EXAMPLES

Examples of the method to optimize the amplitude of water suppression pulse by the MRI apparatus of the present invention are explained below.

Example 1

According to the procedure shown in FIG. 7, the optimal pulse amplitude was computed. In the computation, five measurement points were used, and the stability of the optimal pulse amplitude was confirmed by changing only the initial value of search. Results are shown in FIG. 11, in which FIGS. 11 (a)-(d) are graphs after the fourth fitting, and 1101-1104 are the optimal pulse amplitude determined by this example. As shown in FIG. 11, there is virtually no error of optimal pulse amplitude even the initial value of search is changed.

It is understood that the optimization method of the present invention is able to determine the optimal pulse amplitude more stably with less measurement points, than the absolute value fitting method shown in FIGS. 15 (a) and (b). As mentioned earlier, the absolute value fitting method requires 8th or higher fitting and 9 or more measurement points, for enhancing accuracy. In contrast, the present invention can determine the optimal pulse amplitude accurately by the 4th fitting, and requires only 5 measurement points. Accordingly, the present invention can shorten the measurement time into approximately half of that required for the absolute value fitting method.

Example 2

The water suppression measurement was conducted by using N-acetylalanine phantom. The optimal amplitude of water suppression pulse was computed by applying the optimization method of the present invention. At this time, 4th fitting curve was obtained from the signals obtained with 5 measurement points, and the point in which the signed signal value became 0, was defined as the optimal pulse amplitude. As a comparative example, the optimal pulse amplitude was obtained by using absolute value fitting method for the measurement signal values at the same 5 measurement points.

Measured signal values obtained with the method described in Example 2 and the comparative example and the 4th fitting curve are shown in FIGS. 12 (a) and (b), respectively. 1201 in FIG. 12 (a) is the amplitude of water suppression pulse determined by the present invention. 1202 in FIG. 12 (b) is the amplitude of water suppression pulse determined with the absolute value fitting method.

Then, the water signal suppression measurement was conducted by using N-acetylalanine phantom by setting the optimal pulse amplitude obtained with individual methods, to obtain a spectrum. The spectra measured with the water suppression pulse amplitude 1201 and 1202 are shown in FIGS. 13 (a) and (b), respectively. In the figure, 1301 and 1303 indicate N-acetylalanine signals, and 1302 and 1304 indicate water signals.

In view of the intensities of water signals 1302 and 1304 obtained with two different methods, it is understood that the amplitude of water suppression pulse determined by the present invention is about three-times more suppressed than that determined with the absolute value fitting method. In other words, the pulse amplitude determined with the present invention is more optimal.

INDUSTRIAL APPLICABILITY

According to the present invention, by applying polynomial fitting to the signals polarized based on the changes in the obtained signal phase value, an optimal amplitude of the suppression pulse can be determined more swiftly and more accurately than the conventional method. As a result, since the signals unnecessary for detecting metabolite substances can be sufficiently suppressed, the diagnostic performance is enhanced. Also, the overall measurement time, including the setting and conditioning of subject and main measurement, can be shortened, thereby contributing to the improvement of throughput. Particularly, the present invention is useful in MRSI and MRS which measure metabolite substances, whose signal is weaker than water signal.

BRIEF DESCRIPTION OF THE DRAWINGS

FIG. 1 External view of MRI apparatuses, to which the present invention is applied.

FIG. 2 A block diagram showing the configuration of an MRI apparatus to which the present invention is applied.

FIG. 3 A time chart showing an example of an MRSI pulse sequence to be used in the MRI apparatus of the present invention.

FIG. 4 Diagrams showing examples of region to be excited by the pulse sequence in FIG. 3.

FIG. 5 A time chart of an example of a water suppression pulse sequence to be used in the MRI apparatus of the present invention.

FIG. 6 A block diagram showing means for adjusting the amplitude of suppression pulse according to the present invention.

FIG. 7 A flow chart of one embodiment of procedure for obtaining the optimal suppression pulse amplitude FIG. 8 Graphs explaining the method for obtaining the optimal amplitude of suppression pulse.

FIG. 9 A flow chart of another embodiment of procedure to obtain the optimal suppression pulse amplitude.

FIG. 10 A time chart of an example of a fat suppression spin echo pulse sequence to be used in the MRI apparatus of the present invention.

FIG. 11 Graphs explaining the stability of optimal pulse amplitude to be determined by the present invention.

FIG. 12 Graphs explaining the method for setting the optimal suppression pulse amplitude of the present invention (a) and the absolute value fitting method (b).

FIG. 13 Graphs (a) and (b) explain the intensity of the water signal suppressed with the suppression pulse amplitude determined by the optimal suppression pulse amplitude setting method of the present invention and the absolute value fitting method, respectively.

FIG. 14 A graph showing the method for determining the suppression pulse amplitude using "all-point searching".

FIG. 15 Graphs explaining error in the suppression pulse amplitude due to difference in search location when the absolute value fitting method is used.

FIG. 16 A diagram explaining the principle of the present invention.

DESCRIPTION OF NOTATIONS

2 . . . static magnetic field coil, 3 . . . gradient magnetic field coil, 5 . . . transmission coil, 6 . . . reception coil, 7 . . . transmitter, 8 . . . receiver, 9 . . . calculator, 11 . . . memory device, 14 . . . sequence controller, 61 . . . search condition setting part, 62 . . . signal value calculation part, 63 . . . reference value calculation part, 64 . . . approximate curve computation part, 65 . . . optimalpulse amplitude calculation part, 66 . . . optimal pulse amplitude setting part

The invention claimed is:

1. A nuclear magnetic resonance imaging apparatus comprising;
an imaging means comprising a gradient magnetic field application means which applies a gradient magnetic field to a subject placed on a static magnetic field space, a high-frequency magnetic field pulse irradiating means which irradiates a high-frequency magnetic field pulse on the subject and a receiving means which receives nuclear magnetic resonance signals generated from the subject,
a sequence control means which controls the imaging means and implements a signal suppression pulse sequence including irradiation of at least one high-frequency magnetic field pulse for suppressing signals generated from a given atomic nucleus,
a pulse amplitude adjusting means which adjusts amplitude of the high-frequency magnetic field pulse to be used in the signal suppression pulse sequence,
wherein the pulse amplitude adjusting means comprises an optimal pulse amplitude calculation means, which calculates an optimal pulse amplitude in the signal suppression pulse sequence based on absolute values and phase values of multiple nuclear magnetic resonance signals obtained by implementing the signal suppression pulse sequence in multiple conditions with different pulse amplitude.

2. The nuclear magnetic resonance imaging apparatus according to claim 1,
wherein the pulse amplitude adjusting means is equipped with a signal value calculation means, which calculates a signed signal value (reference signal) from the absolute value and phase value for multiple nuclear magnetic resonance signals obtained by implementing the signal suppression pulse sequence under multiple conditions with different pulse amplitude, and
the optimal pulse amplitude calculation means calculates the optimal pulse amplitude in the signal suppression pulse sequence based on the signed signal values.

3. The nuclear magnetic resonance imaging apparatus according to claim 2,
wherein the pulse amplitude adjusting means has, further, an approximate curve computation part, which obtains an approximate curve by plotting the signed signal values against the amplitude of high-frequency magnetic field pulse, and
the optimal pulse amplitude calculation means obtains the amplitude of high-frequency magnetic field pulse, with which the value of approximate curve computed by the approximate curve computation part becomes 0 or closest to 0, as the optimal pulse amplitude.

4. The nuclear magnetic resonance imaging apparatus according to claim 3,
wherein the signal value calculation means calculates an intermediate value between the maximum and minimum phase values, and gives a positive sign to one and a negative sign to the other of the signal absolute values corresponding to the phase value smaller than the intermediate value and the signal absolute values corresponding to the phase value larger than the intermediate value.

5. The nuclear magnetic resonance imaging apparatus according to claim 3,
wherein the signal value calculation means calculates a change point, where the amount of change in the phase value is $\pi$ or more, or close to $\pi$, and gives a positive sign to one and a negative sign to the other of the signal absolute values measured before the change point and after the change point, respectively.

6. The nuclear magnetic resonance imaging apparatus according to claim 1,
wherein the signal suppression pulse sequence implemented by the sequence control means includes irradiation of multiple high-frequency magnetic field pulses.

7. The nuclear magnetic resonance imaging apparatus according to claim 6,
wherein the sequence control means implements a signal suppression pulse sequence where the multiple high-frequency magnetic field pulses of same amplitude are irradiated per sequence.

8. The nuclear magnetic resonance imaging apparatus according to claim 6,
wherein the sequence control means implements a signal suppression pulse sequence where the multiple high-frequency magnetic field pulses of different amplitude are irradiated per sequence.

9. The nuclear magnetic resonance imaging apparatus according to claim 8,
wherein the pulse amplitude adjusting means computes the optimal pulse amplitude for each of the combinations of multiple high-frequency magnetic field pulses of different amplitude.

10. The nuclear magnetic resonance imaging apparatus according to claim 1,
wherein the sequence control means comprises, as a pulse sequence following the signal suppression pulse sequence, a main measurement pulse sequence including at least one high-frequency magnetic field pulse irradiation and at least one signal measurement.

11. The nuclear magnetic resonance imaging apparatus according to claim 10,
wherein the signal suppression pulse sequence includes radiation of a high-frequency magnetic pulse that suppresses signals from water proton, and
the main measurement pulse sequence is an MRS pulse sequence including irradiation of at least one exciting high-frequency magnetic field pulse and at least one reversing high-frequency magnetic field pulse, and acquisition of free induction decay signal after the irradiation of the reversing high-frequency magnetic field pulse.

12. The nuclear magnetic resonance imaging apparatus according to claim 10,
wherein the signal suppression pulse sequence includes radiation of a high-frequency magnetic field pulse that suppresses signals from water proton, and
the main measurement pulse sequence is an MRSI pulse sequence comprising irradiation of at least one exciting high-frequency magnetic field pulse and at least one reversing high-frequency magnetic field pulse, application of phase encoding gradient magnetic field and acquisition of free induction decay signal after the irradiation of the reversing high-frequency magnetic field pulse.

13. The nuclear magnetic resonance imaging apparatus according to claim 10,
wherein the signal suppression pulse sequence includes the high-frequency magnetic field pulse that suppresses signals from fat proton, and
the main measurement pulse sequence is an MRI pulse sequence including irradiation of at least one exciting high-frequency magnetic field pulse, application of phase encoding gradient magnetic field and readout gradient magnetic field, and acquisition of echo signals.

14. A method for adjusting the amplitude of high-frequency magnetic field pulse in a signal suppression pulse sequence for imaging in a nuclear magnetic resonance imaging apparatus in which a gradient magnetic field is applied to a subject placed on a static magnetic field space, a high-frequency magnetic field pulse irradiates a high-frequency magnetic field pulse on the subject, and nuclear magnetic resonance signals generated from the subject are received, the signal suppression pulse sequence including irradiation of at least one signal suppression high-frequency magnetic field pulse that suppresses signals from a given atomic nucleus contained in the subject, comprising the steps of calculating an optimal pulse amplitude in the signal suppression pulse sequence based on absolute values and phase values of multiple nuclear magnetic resonance signals obtained by implementing the signal suppression pulse sequence under conditions with different pulse amplitude.

15. The method for adjusting the amplitude of high-frequency magnetic field pulse according to claim 14, comprising
step (1) for computing the absolute values and phase values for the multiple nuclear magnetic resonance signals acquired by implementing the signal suppression pulse sequence under multiple conditions with different pulse amplitude,
step (2) for calculating signed signal values (reference signals) for the multiple nuclear magnetic resonance signals based on the absolute values and phase values,
step (3) for obtaining an approximate curve by plotting the signed signal values against the high-frequency magnetic field pulse amplitude, and
step (4) for finding the amplitude of high-frequency magnetic field pulse where the approximate curve becomes 0 or close to 0, as the optimal pulse amplitude.

16. The method for adjusting the amplitude of high-frequency magnetic field pulse according to claim 15,
wherein step (2) for calculating signed signal values comprises step (2-1) for calculating an intermediate value between the maximum and minimum phase values, and step (2-2) for giving a positive sign to one and a negative sign to the other of the signal absolute values corresponding to the phase value smaller than the intermediate value and the phase value larger than the intermediate value.

17. The method for adjusting the amplitude of high-frequency magnetic field pulse according to claim 15,
wherein step (2) for calculating the signed signal value comprises step (2-3) for determining a change point, where the amount of change in the phase value is $\pi$ or more, or is close to $\pi$, and step (2-4) for giving a positive sign to one, and a negative sign to the other of the signal absolute values measured prior to the change point and the signal absolute values measured at and after the change point.

18. The method for adjusting the amplitude of high-frequency magnetic field pulse according to claim 14,
wherein the signal suppression pulse sequence includes irradiation of multiple high-frequency magnetic field pulses, and
the irradiation of the multiple high-frequency magnetic field pulse of the same pulse amplitude is implemented.

* * * * *